United States Patent [19]
Coia
[11] 3,824,584
[45] July 16, 1974

[54] ANALOG-DIGITAL CONVERTER CIRCUIT

[75] Inventor: Pasco A. Coia, Providence, R.I.
[73] Assignee: General Signal Corporation, Rochester, N.Y.

[22] Filed: May 15, 1972
[21] Appl. No.: 253,549

[52] U.S. Cl. .................... 340/347 AD, 340/347 CC
[51] Int. Cl. .......................................... H03k 13/02
[58] Field of Search 340/347 CC, 347 DA, 347 AD; 178/DIG. 12; 328/48

[56] References Cited
UNITED STATES PATENTS

| | | | |
|---|---|---|---|
| 3,351,931 | 11/1967 | Lytle | 340/347 AD |
| 3,436,756 | 4/1969 | Myers | 340/347 CC |
| 3,445,839 | 5/1969 | Engleberg | 340/347 CC |
| 3,508,253 | 4/1970 | James | 340/347 DA |
| 3,534,257 | 10/1970 | Charap | 340/347 CC |
| 3,573,443 | 4/1971 | Fern | 340/347 DA |
| 3,581,116 | 5/1971 | Leostic | 340/347 DA |
| 3,673,398 | 6/1972 | Loffbourrow | 340/347 DA |

*Primary Examiner*—Thomas A. Robinson
*Attorney, Agent, or Firm*—John F. Ohlandt

[57] ABSTRACT

An analog-digital converter circuit that converts electrical input signals, representative of such variables as voltage, current or resistance, into time-impulse signals. The converter circuit as disclosed is designed to accept various input signals for example, signals representing values between 0–5 volts, 4–20 milliamps, 10–50 milliamps, 0–25 kilohms. Signals of this character are converted into time-impulse signals whose pulse width is adjusted to be directly proportional with the magnitude of the input signals. When the aforementioned analog input electrical signals are so converted they are then adapted to be transmitted great distances via telephone lines, or radio-microwave communication links, without distortion. Such form of output signals are adapted for transmission in connection with certain time-impulse telemetering systems, for example, a system known as the Chronoflo system. When used with such Chronoflo system, a 0–5 volt signal would be adjusted to give a 0–13.333 second pulse, whose repetition cycle would be 15 seconds. The converter of the instant invention includes provision for accepting various input signal levels and for modifying the output time-impulse signal to conform to a variety of time-impulse formats. Another provision which is included is a masking of the input signals which occur below a prescribed level. This masking of input signals below a threshold prevents spurious signal generation due to low level noise at the input.

9 Claims, 7 Drawing Figures

ANALOG-DIGITAL CONVERTER CIRCUIT

BACKGROUND, OBJECTS AND SUMMARY OF THE INVENTION

The present invention pertains to analog-digital converters and more particularly to a converter circuit that converts electrical analog input signals into digital or time-impulse signals.

The circuit of the present invention is particularly suitable for converting analog input signals into an output signal form that can be transmitted over great distances via telephone lines or the like. The circuit is especially adapted to be used with time-impulse telemetering systems of the type described in U.S. Pat. Nos. 3,417,390 and 3,378,816, both of which are assigned to the assignee of the present invention.

The converter circuit of the present invention is extremely flexible in that it can accept electrical signals representative of a variety of electrical parameters and can convert such input signals into a time-impulse signal. Accordingly, the circuit can accept input signals representative of voltage, current, or resistance from a given input source.

A further provision of the converter circuit is that it can accept various input signal levels and is able to modify the output-time-impulse signal to conform to a variety of time-impulse formats.

Yet a further provision, constituting a major feature of the present invention, resides in a capability known as ramp characterization. In accordance with this ramp characterization feature input signals below a prescribed level or threshold are masked, thereby preventing their being coded into an output signal. As a result, input signals below a threshold, such as noise signals, cannot generate spurious signals at the output.

More specifically the present invention provides a circuit for converting analog input electrical signals into time-impulse signals whose pulse width is directly proportional with the input signals, comprising a ramp voltage generator of the digital type which includes a digital counter and additional flip flops if desired; a comparator having one input connected to the ramp voltage generator and another input connected to the variable input source; a utilization device, typically in the form of a relay, connected to the output of said comparator when the input signal on the one input of the comparator is smaller than the input signal on the other input.

The circuit of the present invention also includes the necessary power supplies for operating the various components of the system and, as noted above, includes a utilization device in the form of a relay in the case where high isolation is desired between the converter circuit and any load to which it is to be electrically connected.

DESCRIPTION OF PREFERRED EMBODIMENT

Figures 1A, 1B:
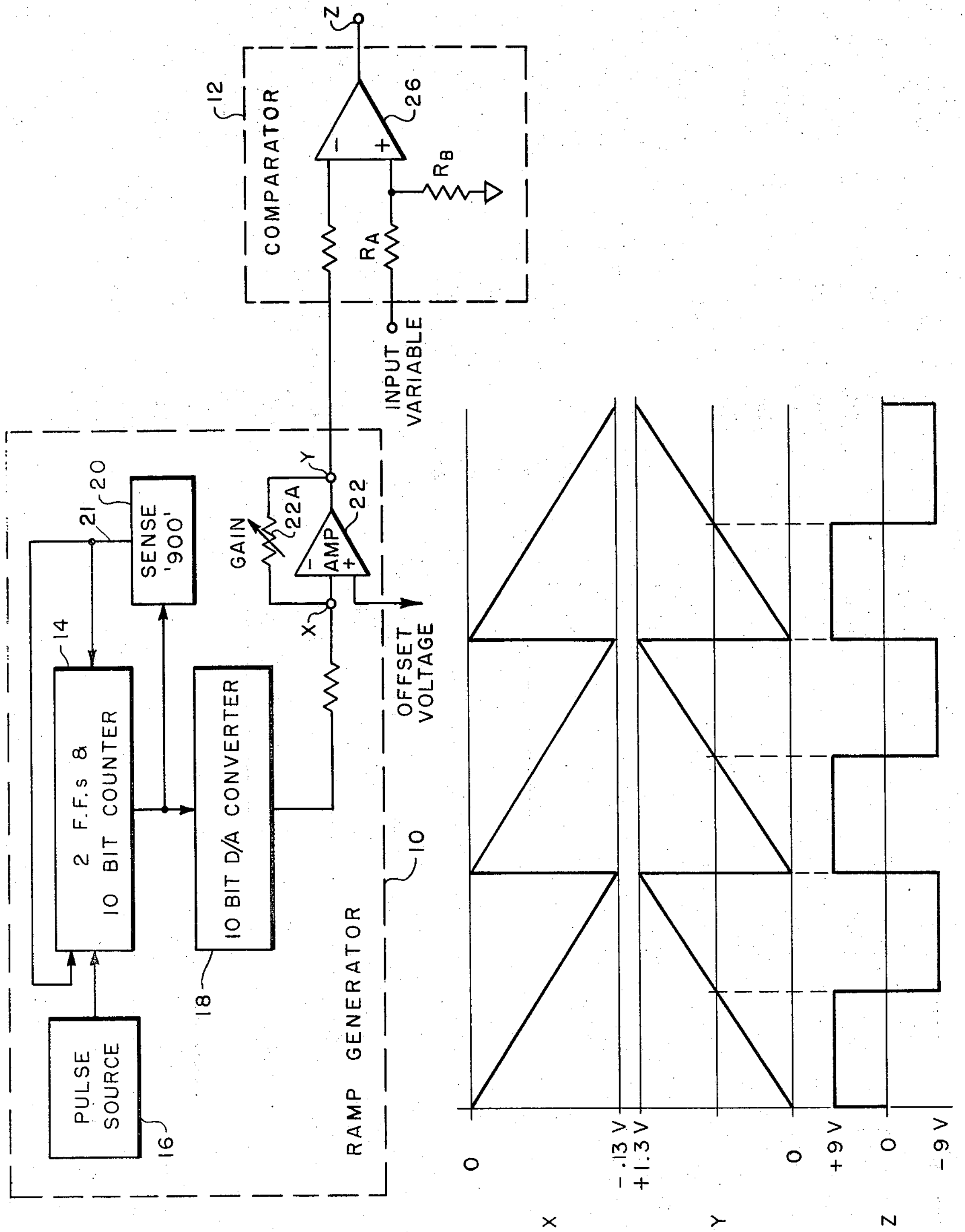
FIG. 1A is a block-schematic diagram of the principal constituents of the converter circuit of the present invention in accordance with a preferred embodiment thereof.
FIG. 1B is a pulse diagram of the different pulse forms appearing at the points X, Y and Z in the circuit of FIG. 1A.

Referring now to FIGS. 1A and 1B, there is shown the basic layout of the converter circuit and a pulse diagram accompanying same. A ramp generator 10 is connected to a comparator 12 so that the ramp generated can be compared with the variable input signal from the typical source and the output in the form of a pulse can be obtained, the pulse width being directly proportional with the input signal.

In order to overcome the known obvious shortcomings of an integrator-type ramp generator, the ramp generator 10 is a digital type. This type of ramp generator can be easily synchronized to a frequency standard such as a power line. Most importantly from the standpoint of the ramp characterization feature of the present invention, it permits easy ramp characterization when such characterization is desired.

The ramp generator 10 comprises a 10-bit digital counter and two additional flip flops in a device designated 14. The two additional flip flops can be used to divide a suitable pulse train by 4, if desired. A pulse source 16 supplies either 60 Hz or 120 Hz. The two flip flops and the 60 or 120 Hz option in combination allow wide flexibility for selecting various time-impulse formats.

The output from the 10 bit counter of device 14 is converted into an analog voltage through known digital-analog techniques by the use of a digital-analog converter 18. A pulse-sensing circuit 20 determines the maximum allowable count that may occur before resetting of the 10-bit counter with a reset pulse on the "clear" input line 21. This "sense 900" circuit in FIG. 1A will reset the 10-bit counter after 900 pulses have been registered and the clock pulse drops to 0. This additional input gating assures that the counter has reached a quiescent state before being reset thus eliminating false resetting. A count of 900 is reached 15 seconds after the counter starts accumulating pulses. This establishes the cyclic rate of the output time impulse circuit. The inputs to the "sense 900" circuit can be varied to produce cyclic rates other than 15 seconds, such as 4, 8, and 60 seconds.

The analog output from the converter 18 is a series of 900 steps in the voltage level, as indicated at the leading edge of the first pulse in the diagram designated X of FIG. 1B. This series starts at 0 volts and increases in a negative direction to approximately −0.130 volts. Inasmuch as this ramp voltage is quite small in magnitude, an amplifier with a gain of approximately 10 is used to amplify the signal and invert its polarity to +1.30 volts. Amplifier 22 is used for amplifying the signal and the inversion necessary is accomplished by inserting the −0.130 volts into the inverting input of amplifier 22, i.e., into the input marked (−). A positive going ramp of 1.30 volts maximum is then compared with a variable input signal in a comparator 12 as seen in FIG. 1A.

Comparator 12 consists of an operational amplifier 26 in open-loop mode. The gain of such an amplifier in open-loop mode is quite high — in the order of several thousand. An input voltage of 0 – 1 volts is developed across $R_B$: hence into amplifier, for various input variables by using $R_A$ as a series resistor with $R_B$ so as to form a voltage divider. The plus input of the amplifier does not invert the polarity of its input signal. Hence a positive voltage applied to the plus terminal will produce a positive, saturated output of the comparator. However, a positive input to the minus terminal, which is the terminal to which the ramp generator output is connected, will produce a negative output from the comparator. Whichever of the two inputs is larger will determine the polarity of the output. The two inputs can be seen on diagram Y in which the input variable is shown as having a constant amplitude and the sawtooth wave is the output from the ramp generator. Accordingly, if the ramp generator output connected to the minus terminal is larger than the input on the plus terminal, the comparator output will be negative; if the input variable is larger than the ramp, the comparator output will be positive. It is during the time that the comparator output is positive that the time-impulse signal is generated through subsequent circuitry. The output signal from the comparator will be seen by reference to pulse diagram Z, which depicts the potential at the point Z shown on FIG. 1A.

Since the time that the comparator output signal is positive is determined by both the ramp slope and the input variable, for a fixed input such as has been assumed in diagram Y, the output can be varied by adjusting the slope or gain of the ramp amplifier 22. Thus, as can be seen, the feedback resistor 22A can be suitably varied to adjust the ramp slope.

It should be especially noted that the voltage divider consisting of $R_A$ and $R_B$ at the input to amplifier 26 will serve as a ranging circuit, being used to drop any voltage higher than a 0 – 1 volt span into a 0 – 1 volt span across $R_B$. Accordingly, if at the input there were a range of 0 – 10 volts, $R_A$ would be selected to have a value of approximately 9,000 ohms, whereas $R_B$ would have a value of 1,000 ohms. In the case of current inputs, $R_A$ would be shorted out, and then $R_B$ would be selected to produce 1 volt with the maximum current in the given range flowing through it.

However, in the case of input signals that are representative of resistance values, a conditioning amplifier (not shown), is required. In accordance with standard operational amplifier theory, it can be shown that the output of an inverting amplifier configuration is proportional to the ratio of the two resistors multiplied by the negative of the input voltage ($E_{out} - E_{in}$ (RF/RI), where $R_F$ is a feedback resistor and $R_I$ is an input resistor). Assuming an input voltage of −1.0 volts and an $R_I$ of 25,000 ohms, a feedback resistor $R_F$ having a value of 25,000 ohms will produce an output voltage of +1 volt. If $R_F$ is reduced to 2,500 ohms, the output voltage $E_{out}$ will decrease to 0.1 volt, showing that $E_{out}$ is directly proportional to $R_F$, under the assumption that $R_I$ and $E_{in}$ are held constant. $R_I$ and $E_{in}$ are constant for each full scale value of $R_F$ which now becomes the input variable in the form of a resistor. In actual practice and because $R_F$ can vary over large values, $R_I$ is made adjustable so as to set $R_I$ equal to $R_F$ at the maximum of $R_F$. Of course it will be understood that the output of the conditioning amplifier, not shown, is fed to the input of the comparator at the terminal designated "input variable" of amplifier 26.

The output of the comparator 12 determines whether the time-impulse circuit is on or off. As mentioned earlier, a positive output at the output point Z produces the time-impulse signal. Reference to pulse diagram Z of FIG. 1B illustrates the pulse form at the output of the comparator 12. Because the positive 9 volt signal is that which produces the time-impulse output, this portion of the wave will have to be enhanced through further circuitry. This is accomplished by the output circuitry illustrated in FIG. 2A. The plus or minus 9 volt signal is passed through a zener diode 30 such diode being of type IN4737A which has a voltage drop of 7.5 volts. The output of zener diode 30 is connected to the input of a logic inverter 32, which is referenced to −4 volts. Therefore, during the time that a −4 volt signal is applied to the logic inverter, the logic inverter sees no input but, by definition, a logic inverter has an output only when there is no input. Accordingly an output of −9 volts will be present at the inverter output. (This −9 volt output reference to 0 volts is also the same as −5 volts referenced to the −4 volt.) The −9 volt signal is passed through another zener diode 34 (IN4734; 5.6 volts). Thus the 5.6 zener diode voltage when subtracted from −9 volts, provides pnp transistor 36 (Type 2N4036) with a proper keying or grating voltage at its input. Conduction of transistor 36 in response to the input voltage causes an output relay 38 to become energized.

Figures 2A, 2B, 3:
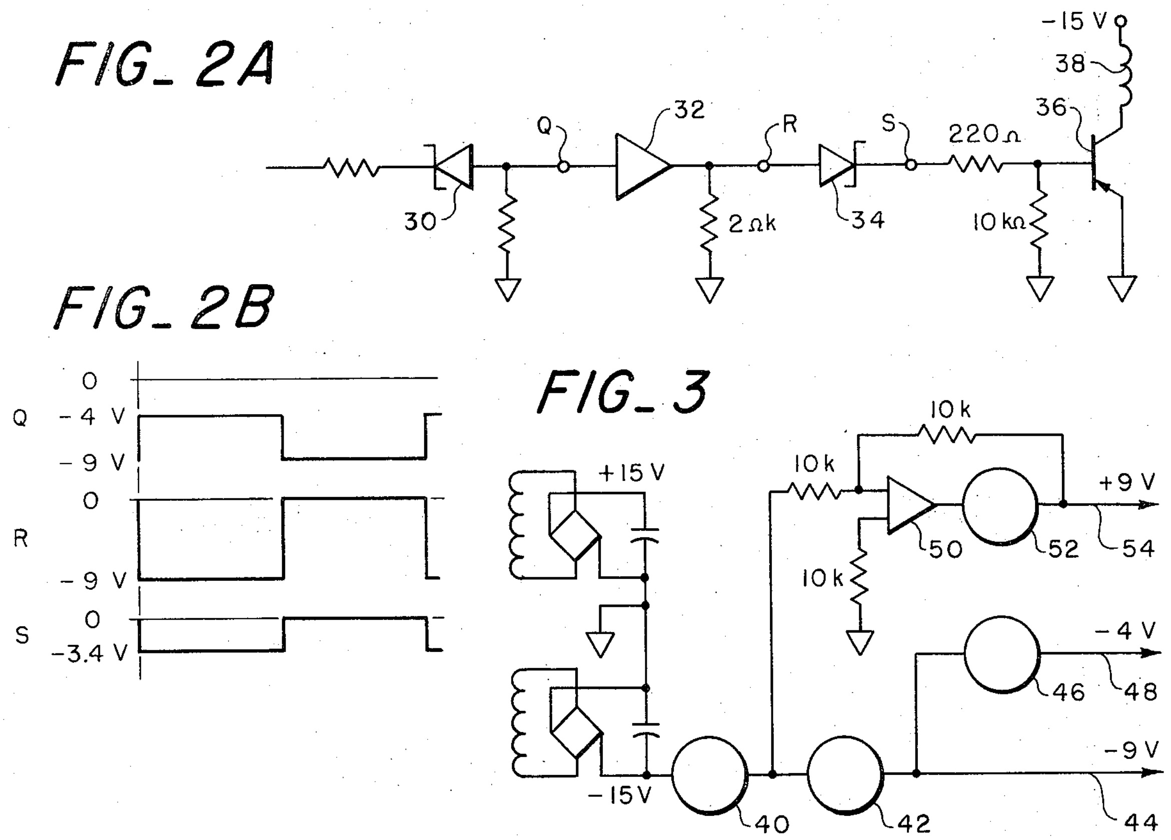
FIG. 2A is a schematic diagram of suitable output circuits for use with the comparator of the present invention.
FIG. 2B is a pulse diagram of the different pulse forms appearing at the points Q, R and S in the circuit of FIG. 2A.
FIG. 3 illustrates a typical power supply arrangement for supplying power to the several circuits.

The various voltage references that have been indicated in FIG. 2A are cited only to illustrate that a waveform varying between ±9 volts must be amplified in a logic inverter whose reference is determined by its supply voltage of −4 volts.

Referring now to FIG. 3, the several power supplies that are required are implemented by the circuitry shown therein, the power supplies illustrated providing regulated voltages of +9, −9 and −4. Also available are +15 and −15 volts unregulated. Standard bridge rectifier techniques are utilized to rectify the input AC voltage into + and −15 volts. The −15 volt output enters a −9 volt regulator 40 and, because it cannot provide the required −9 volts at a sufficient power level, an emitter-follower power amplifier 42 is used. Beyond the emitter-follower 42, a well regulated −9 volts is distributed by the power bus 44 to the logic circuits and amplifying circuits which constitute the complete system. The −9 volts is further reduced to −4 volts to supply certain logic circuits. This is accomplished by means of the regulator 46 supplying the power bus 48. Certain offset adjustments of the circuitry require a well regulated +9 volts as well as the aforesaid − 9 volts. Moreover, any drift in the −9 volt supply should be met with an equal drift in the opposite direction in the +9 volt supply. To accomplish this a +9 volt regulator that will track the −9 volt supply is used. This regulator is designated 50 in FIG. 3 and is arranged in a gain of 1 inverting configuration. Thus a −9 volt reference is inverted to + with a gain of 1 so as to provide the +9 volts required and this is accomplished through a power boosting emitter-follower 52 and thence by means of the power bus 54 to the offset circuits. If for some reason the −9 volt supply should momentarily drift down to −8.8 volts, for example, the output of the tracking regulator 50 would also drop to +8.8 volts. Because the offset circuits actually take a very small portion of the difference of the +9 volt and −9 volt regulators, the change from 9 volts to 8.8 volts is self-cancelling, producing no offset change on its own.

Figures 4A, 4B:
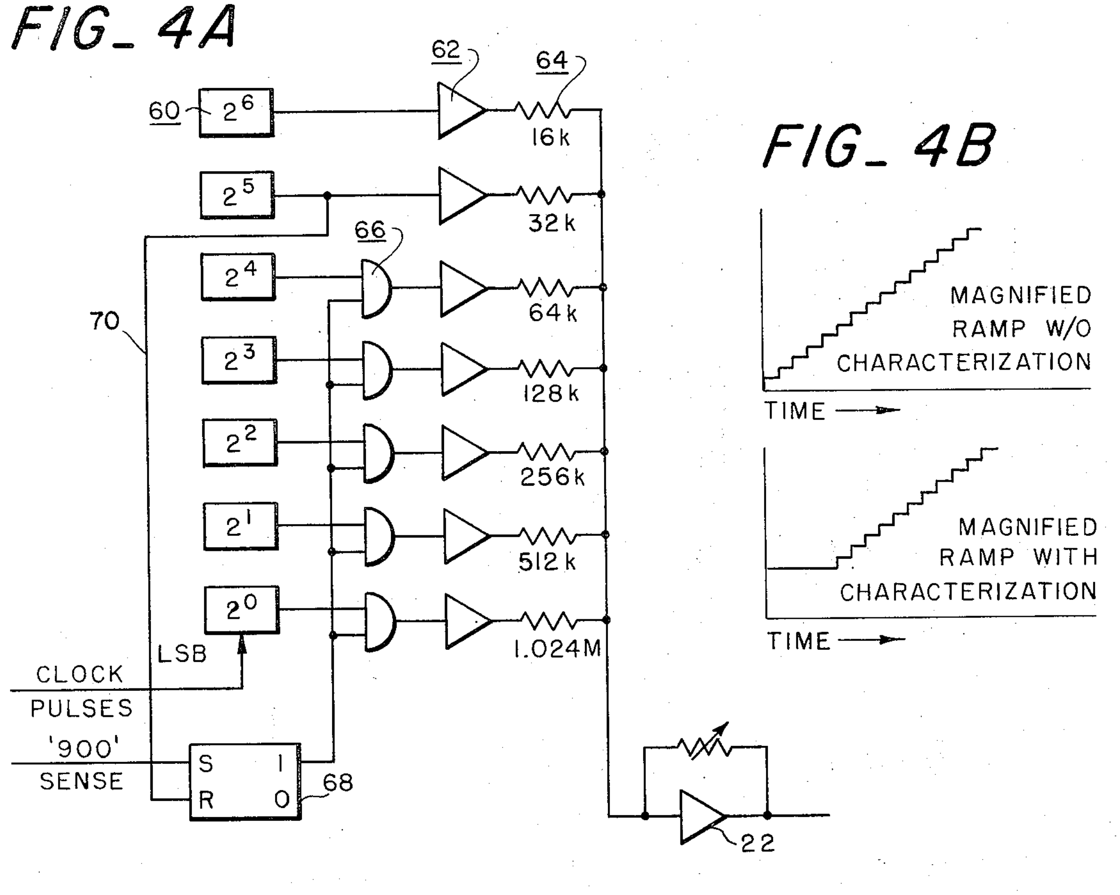
FIG. 4A is a somewhat detailed schematic diagram of the ramp characterization subcircuit of the ramp generator.
FIG. 4B is a pulse diagram illustrating the pulse forms obtained with and without the ramp characterization feature.

The ramp characterization feature of the present invention will be understood by reference to FIG. 4A which illustrates portions of the 10 bit counter 14 previously shown in FIG. 1A and portions of the 10 bit digital to analog converter 18 also shown in FIG. 1A. A plurality of counter cells 60 are illustrated, these being 7 in number out of the total of 10 in the 10 bit counter. A like plurality of drivers 62 and ladder resistors 64 are connected to the counter cells 60. The outputs are commoned together and connected to the input of the ramp amplifier 22. Between the counter cells 60 and the drivers 62 there are interposed five OR gates 66. These functional gates are physically constructed of two NOR gates in series. This is for the reason that NOR gates are easier to obtain and are generally of lower cost than OR gates. It is the use of these OR gates that operate to characterize the ramp voltage so as to alter the input/output relationship of the analog-digital converter of the present invention. Such characterization is necessary or is sometimes desirable in order to remove the output signal from the converter device of the present invention when the input signal drops for example to 4 percent. This requirement may become desirable due to poor response of the output load at low signal inputs.

Referring again to the designated OR gate 66, each OR gate has connected to one of its inputs the output of a flip flop device 68. Such flip flop device is known as a RSFF device because it provides reset and set input controls. Hence RSFF stands for reset, set, flip flop. Each of the other inputs to the OR gates 66 is connected to the outputs of the five lowest significant bits of the digital counter. Thus it will be seen that the OR gates are connected to the lower five cells in the group 60. Accordingly, if either of the two inputs of any of the five OR gates 66 has a high logic level, the high logic level is gated through the particular OR gate to the appropriate resistor driver in the group 64. If we first assume that the common connection to the five OR gates is at a low level (RSFF - OFF), the circuit will behave as if no OR gates were there, and consequently the binary count producing the ramp voltage will be connected to the resistor drivers. If, however, the RSFF, that is device 68, should be ON, i.e., a high level exists at the common OR gate connections, then the five resistor drivers that obtain their drive level through the OR gates 66 will go on, thereby causing a voltage at the output that would be proportional to the value of the five least significant bits of the ten bit counter.

It will be understood that the device 68 is connected to other parts of the converter circuit of the present invention such that at the instant that the 900 count is sensed by the device 20, this device produces resetting of all of the counters to 0 so as to start the ramp voltage increasing again from 0, while simultaneously setting the device 68. As a result of setting the device 68, a high level appears at the terminal marked 1 of the device 68. The device 68 stays set until the count of 32 is reached. At this instant the device 68 is reset by reason of the signal received on line 70 from the output of the cell labelled $2^5$, and the high level that was presented to the 5 OR gates 66 now drops to 0. Now the OR gates will operate as a result of the binary count occurring in the ten bit counter. The cycle of setting and resetting the device 68 will repeat each time the 900 count is sensed.

The ultimate effect of the ramp characterization feature is that the ramp does not quite return to 0 at the beginning of each time-impulse cycle, but to a value equal to (32/900) of the maximum ramp value, remaining at this fixed level for the 32 clock pulses, then rising linearly with time to the 900 clock pulse level and restarting at 32 pulses again. This effect can be seen by reference to FIG. 4B in which both the magnified ramp with characterization and without such characterization are depicted.

Recalling that a time-impulse signal is generated whenever the ramp voltage from the ramp generator 10 is less than the input signal to the comparator 12, no time-impulse signal will be generated if the input signal has a lower voltage level than the ramp level obtained at 32 clock pulses. 32 clock pulses represents 4 percent of 800 pulses, which corresponds to full scale inasmuch as an arbitrary eight-ninths of the cycle time of 15 seconds (15 seconds = 900 pulses) has been found to be useful. Accordingly, an input signal of 4 percent of full scale will not cause an output time-impulse signal to be generated.

It will have become apparent that the preferred embodiment, as described, will fulfill the purposes previously set forth. That is to say, the analog-digital circuit will accept electrical signals representative of a wide variety of electrical parameters and will convert such input signals into a time impulse signal whose pulse width is directly proportional to the input signals. Moreover the converter circuit efficiently generates a ramp signal for comparison with the input signals and permits easy ramp characterization, whereby signals that are below a prescribed level or threshold are not coded into an output signal so that they cannot generate spurious signals.

It should be especially noted that the ramp characterization feature does not cause any distortion in the output signal, that is, if the input signal, for example, was equivalent to 5 percent, an output time-impulse signal equivalent to 5 percent would be generated. A 4.1 percent signal produces a 4.1 percent output, and a 4.0 percent signal may or may not produce a 4 percent output signal, depending on the accuracy of calibration and noise on the input signal. However, a 3.0 percent input signal would not produce any output time-impulse signal, nor would any input signal less than 3.9 percent. To obtain output signals at less than 4 percent maximum, the ramp characterization circuit could be disabled.

What is claimed is:

1. A circuit for converting analog input electrical signals into time-impulse signals comprising a ramp voltage generator and a variable input source, both of which have a common reference voltage;

a comparator having one input connected to said ramp voltage generator and another input connected to said variable input source, the output of said comparator providing that a time-impulse output signal is generated when the ramp voltage at the one input is less than the variable input signal at the other input;

a utilization device connected to the output of said comparator operable in response to said time-impulse signal; and a ramp characterization means for providing that the ramp signal does not quite return to said common reference voltage at the beginning of each cycle, but to a predetermined fixed voltage value, equal to a fraction of the maximum voltage value, for a time period corresponding to the time period it would normally take the ramp voltage to reach said predetermined voltage value, whereby input signals below said predetermined voltage value will not produce a time-impulse output signal.

2. A circuit as defined in claim 1, in which said ramp voltage generator includes a pulse source, a binary counter, and a digital-to-analog converter for converting a predetermined number of pulses counted by said binary counter into a ramp signal.

3. A circuit as defined in claim 2 in which said ramp characterization means comprises a plurality of logic devices each having one of its inputs connected to a respective one of a plurality of counter cells corresponding to the lowest significant bits of said binary counter.

4. A circuit as defined in claim 3, in which said ramp characterization means further comprises a flip flop device having an output connected in common to the other inputs of said logic devices, the outputs of said logic devices being connected to said digital-to-analog converter.

5. A circuit as defined in claim 4 in which the pulse width of the time-impulse signals is directly proportional with the magnitude of the input signals.

6. A circuit as defined in claim 5, further including a device for sensing the predetermined count and for resetting said counter.

7. A circuit as defined in claim 6 in which said sensing device is connected to said flip flop device.

8. A circuit as defined in claim 1, further including input conditioning and ranging circuitry at the input to said comparator for converting variable input signals to prescribed ranges.

9. A circuit as defined in claim 1, further including output circuitry for translating the comparator output signal, which includes positive and negative portions, into a signal of single polarity.

* * * * *